(12) United States Patent  
Cheng et al.

(10) Patent No.: US 9,305,687 B2  
(45) Date of Patent: Apr. 5, 2016

(54) CURRENT SENSING RESISTOR

(71) Applicant: CYNTEC CO., LTD., Hsinchu (TW)

(72) Inventors: Hsing-Kai Cheng, Hsinchu (TW); Yu-Jen Lin, Hsinchu (TW); Yen-Ting Lin, Hsinchu (TW); Ta-Wen Lo, Hsinchu (TW)

(73) Assignee: CYNTEC CO., LTD., Hsinchu (TW)

(*) Notice: Subject to any disclaimer, the term of this patent is extended or adjusted under 35 U.S.C. 154(b) by 141 days.

(21) Appl. No.: 14/292,325

(22) Filed: May 30, 2014

(65) Prior Publication Data

US 2014/0266568 A1 Sep. 18, 2014

Related U.S. Application Data

(63) Continuation-in-part of application No. 13/452,265, filed on Apr. 20, 2012, now Pat. No. 8,779,887, which is a continuation-in-part of application No. 12/779,656, filed on May 13, 2010, now Pat. No. 8,183,976.

(30) Foreign Application Priority Data

Aug. 13, 2013 (TW) .............................. 102129026 A

(51) Int. Cl.
*H01C 7/13* (2006.01)
*G01R 1/20* (2006.01)
*H01C 1/148* (2006.01)
*H01C 7/00* (2006.01)

(52) U.S. Cl.
CPC *H01C 7/13* (2013.01); *G01R 1/203* (2013.01); *H01C 1/148* (2013.01); *H01C 7/003* (2013.01)

(58) Field of Classification Search
CPC .................................. G01R 1/203; H01C 7/13
See application file for complete search history.

(56) References Cited

U.S. PATENT DOCUMENTS

| | | | | |
|---|---|---|---|---|
| 4,484,244 A | * | 11/1984 | Avery | H01L 27/0248 361/111 |
| 4,486,738 A | * | 12/1984 | Sadlo | H01C 17/006 219/543 |
| 4,772,520 A | | 9/1988 | Takeno et al. | |
| 5,287,083 A | | 2/1994 | Person et al. | |
| 5,604,477 A | | 2/1997 | Rainer et al. | |
| 5,999,085 A | * | 12/1999 | Szwarc | H01C 7/13 338/309 |

(Continued)

FOREIGN PATENT DOCUMENTS

EP 1708208 10/2006
TW 200636763 10/2006

(Continued)

*Primary Examiner* — James Harvey
(74) *Attorney, Agent, or Firm* — Kirton McConkie; Evan R. Witt

(57) ABSTRACT

A resistor device includes a resistor plate having opposite first and second surfaces; a first metal layer including first and second portions which are disposed on the first surface of the resistor plate at opposite first and second sides, respectively; and a second metal layer including a first sensing pad, a second sensing pad, a first current pad and a second current pad, separate from one another, wherein the first sensing pad and the first current pad are disposed on the first portion of the first metal layer and the second sensing pad and the second current pad are disposed on the second portion of the first metal layer. A protective layer is preferably provided, overlying the resistor plate and the first metal layer uncovered by the second metal layer.

17 Claims, 17 Drawing Sheets

(56) References Cited

U.S. PATENT DOCUMENTS

| | | | |
|---|---|---|---|
| 6,005,474 A * | 12/1999 | Takeuchi | H01C 1/142 29/620 |
| 6,469,614 B2 * | 10/2002 | Muziol | H05K 3/4015 338/203 |
| 6,794,985 B2 | 9/2004 | Nakamura et al. | |
| RE39,660 E * | 5/2007 | Szwarc | H01C 7/13 219/216 |
| 8,183,976 B2 * | 5/2012 | Lo | H01C 1/148 338/20 |
| 8,531,264 B2 | 9/2013 | Li et al. | |
| 8,558,656 B2 | 10/2013 | Wang et al. | |
| 9,054,523 B2 * | 6/2015 | Sohn | H01H 71/125 |
| 2006/0220740 A1 | 10/2006 | Bessho et al. | |
| 2006/0273423 A1 | 12/2006 | Tsukada | |
| 2009/0284342 A1 | 11/2009 | Tsukada | |
| 2011/0057764 A1 | 3/2011 | Smith et al. | |
| 2011/0063072 A1 * | 3/2011 | Lo | H01C 1/148 338/314 |
| 2012/0200383 A1 * | 8/2012 | Lo | G01R 1/203 338/314 |
| 2013/0025915 A1 * | 1/2013 | Lin | B32B 7/02 174/254 |
| 2013/0187749 A1 * | 7/2013 | Tsukada | H01C 1/148 338/306 |
| 2014/0266568 A1 * | 9/2014 | Cheng | G01R 1/203 338/314 |

FOREIGN PATENT DOCUMENTS

| | | |
|---|---|---|
| TW | 200830333 | 7/2008 |
| TW | I381170 | 1/2013 |
| WO | 2006/080805 | 8/2006 |

\* cited by examiner

CURRENT SENSING RESISTOR

CROSS-REFERENCE TO RELATED APPLICATIONS

The present application is a continuation-in-part application claiming benefit from a pending U.S. Patent Application bearing a Ser. No. 13/452,265 and filed Apr. 20, 2012, which is a continuation-in-part application claiming benefit from a parent U.S. Patent Application bearing a Ser. No. 12/779,656 and filed May 13, 2010, and issued as U.S. Pat. No. 8,183,976, contents of which are incorporated herein for reference.

FIELD OF THE INVENTION

The present invention relates to a resistor device, and more particularly to a resistor device adapted to current sensing.

BACKGROUND OF THE INVENTION

A current sensing resistor, when serially connected to a load and applied current thereto, results in a voltage drop which may be measured and referred to estimate the current intensity. Since the resistance of a current sensing resistor is generally at a milliohm (mOhm) order, high resistance precision, e.g. with deviation within ±1%, is required compared to a common resistor. Accordingly, proper adjustment is generally performed in the manufacturing process of the current sensing resistor after measuring resistance of the newly produced resistor and calculating deviation of the measured resistance from a preset ideal value. Repetitive measurement and adjustment are performed until the measured resistance is close enough to the preset ideal value.

Conventionally, Kelvin measurement, which is a four-point type of measurement, is adopted to measure resistance of a current sensing resistor. The principle will be described hereinafter.

Please refer to FIG. 1, which schematically illustrates circuitry associated with Kelvin measurement. As shown, two ends of a resistor 15 whose resistance R is to be measured are respectively connected to four points 11, 12, 13 and 14. The points 13 and 14 are further respectively connected to head and tail ends of a constant current source 16 which supplies a constant current intensity I. On the other hand, the points 11 and 12 are coupled to respective probes with high impedance for measuring voltage difference therebetween. Since the input impedance of the probes coupled to the points 11 and 12 is relative high, it is assumed that no current would pass through point 11, resistor 15 and point 12, i.e. $i_1=0 \cdot i_2=0$. Under this circumstance, the constant current source 16, point 14, resistor 15 and point 13 form a circuit loop, and the voltage difference V between the points 11 and 12, where $V=V_{11}-V_{12}$, can be measured and used for calculating resistance of the resistor 15 based on Ohm's Law, i.e. V=IR.

FIG. 2A illustrates a structure of a conventional current sensing resistor. The current sensing resistor 100 includes a resistor plate 120 and two electrode plates 110 and 130 respectively welded to opposite sides of the resistor plate 120 and having recesses 140 and 150. On the electrode plates, sensing pads 111 and 131 and current pads 112 and 132 are defined as measuring area. When producing the current sensing resistor 100, a constant current I is applied between the current pads 112 and 132, and a voltage difference rendered between the sensing pads 111 and 131 ($V_{diff}=V_{111}-V_{131}$) when the constant current I passes through the current sensing resistor 100 is measured. Accordingly, resistance R1 of the resistor 120 can be calculated as $R1=V_{diff}/I$.

Please refer to FIG. 2B, which illustrates four measurement points defined in a measuring apparatus for measuring resistance of a newly produced resistor. The four measurement points 161, 162, 163 and 164 are arranged on the electrode plate in zones 171, 172, 173 and 174 as a rectangle, as shown in FIG. 2C, wherein the measurement points 163 and 164 are associated with constant current input and the measurement points 161 and 162 are associated with output voltage measurement.

The produced resistor is then performed with a barrel plating process to be electroplated with a soldering layer for facilitating the mounting of the resistor onto a printed circuit board (PCB).

In the resulting structure, there is exposed metal between the sensing pad 111 and the current pad 112, as well as the sensing pad 131 and the current pad 132, i.e. next to the recesses 140 and 150. Since the so-called 4T structure described above is adapted to be used in a low-resistance product, e.g. lower than 5 mΩ, it is critical to minimize variations in manufacturing processes. For example, if the thickness of the layers and/or the area of the exposed metal vary, the value and uniformity of resistance, and thus the stability and yield of the product, would be adversely affected.

SUMMARY OF THE INVENTION

The present invention provides a current sensing resistor, which eliminates the effect of the exposed metal between the sensing pads and the current pads so as to assure of constant resistance.

The present invention provides a resistor device, which includes a resistor plate having opposite first and second surfaces; a first metal layer including first and second portions which are disposed on the first surface of the resistor plate at opposite first and second sides, respectively; and a second metal layer including a first sensing pad, a second sensing pad, a first current pad and a second current pad, separate from one another, wherein the first sensing pad and the first current pad are disposed on the first portion of the first metal layer and the second sensing pad and the second current pad are disposed on the second portion of the first metal layer.

In an embodiment, none of the first sensing pad, second sensing pad, first current pad and second current pad of the second metal layer extend beyond the area of the first metal layer. For example, each of the first sensing pad and the first current pad of the second metal layer has smaller length and width than the first portion of the first metal layer, and each of the second sensing pad and the second current pad of the second metal layer has smaller length and width than the second portion of the first metal layer.

In an embodiment, the resistor device further comprises a protective layer, which overlies the resistor plate between the first portion and the second portion of the first metal layer and extensively overlies the first metal layer uncovered by the second metal layer.

In an embodiment, a level of the protective layer is lower than that of the second metal layer.

In an embodiment, the resistor device further comprises a solder layer overlying the first sensing pad, second sensing pad, first current pad and second current pad of the second metal layer.

In an embodiment, the resistor device further comprises a slit created in the resistor plate between the first sensing pad and the second sensing pad or between the first current pad and the second current pad, and having a specific length for fine-tuning resistance.

In an embodiment, the resistor device further comprises an auxiliary layer on the second surface of the resistor plate for strengthening the resistor device and preventing from heat warp.

In an embodiment, the resistor device further comprises a carrier plate for supporting the resistor plate, which is disposed between the resistor plate and the auxiliary layer.

BRIEF DESCRIPTION OF THE DRAWINGS

The above contents of the present invention will become more readily apparent to those ordinarily skilled in the art after reviewing the following detailed description and accompanying drawings, in which.

DETAILED DESCRIPTION OF THE PREFERRED EMBODIMENT

The present invention will now be described more specifically with reference to the following embodiments. It is to be noted that the following descriptions of preferred embodiments of this invention are presented herein for purpose of illustration and description only; it is not intended to be exhaustive or to be limited to the precise form disclosed.

Figure 1:
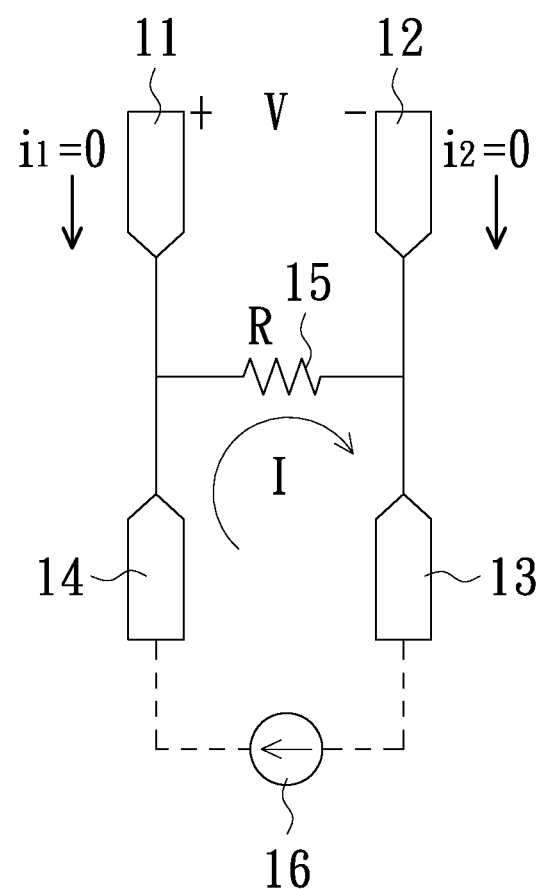
FIG. 1 is a schematic circuit diagram illustrating Kevin measurement.
Figure 2A:
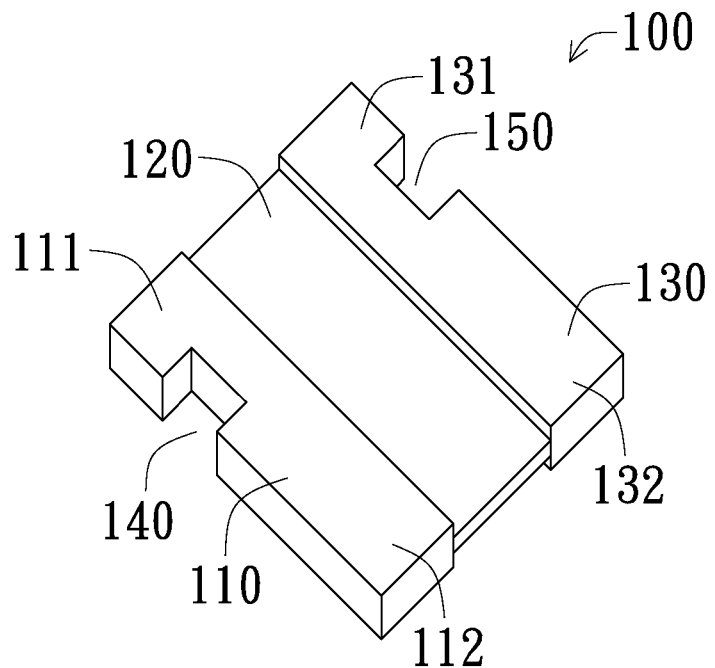
FIG. 2A is a schematic diagram illustrating a structure of a current sensing resistor according to prior art.
Figure 2B:
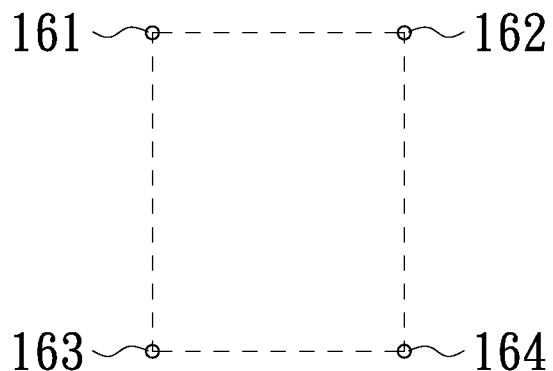
FIG. 2B is a schematic diagram illustrating four measurement points used for measuring resistance by a measuring apparatus in a production line of resistors.
Figure 2C:
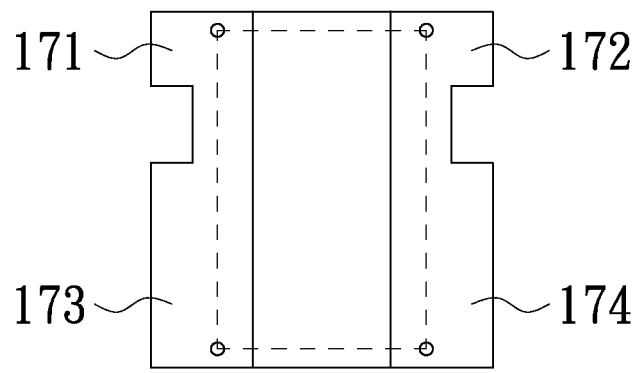
FIG. 2C is a schematic diagram illustrating the distribution of four measurement points on a resistor plate.
Figure 3A:
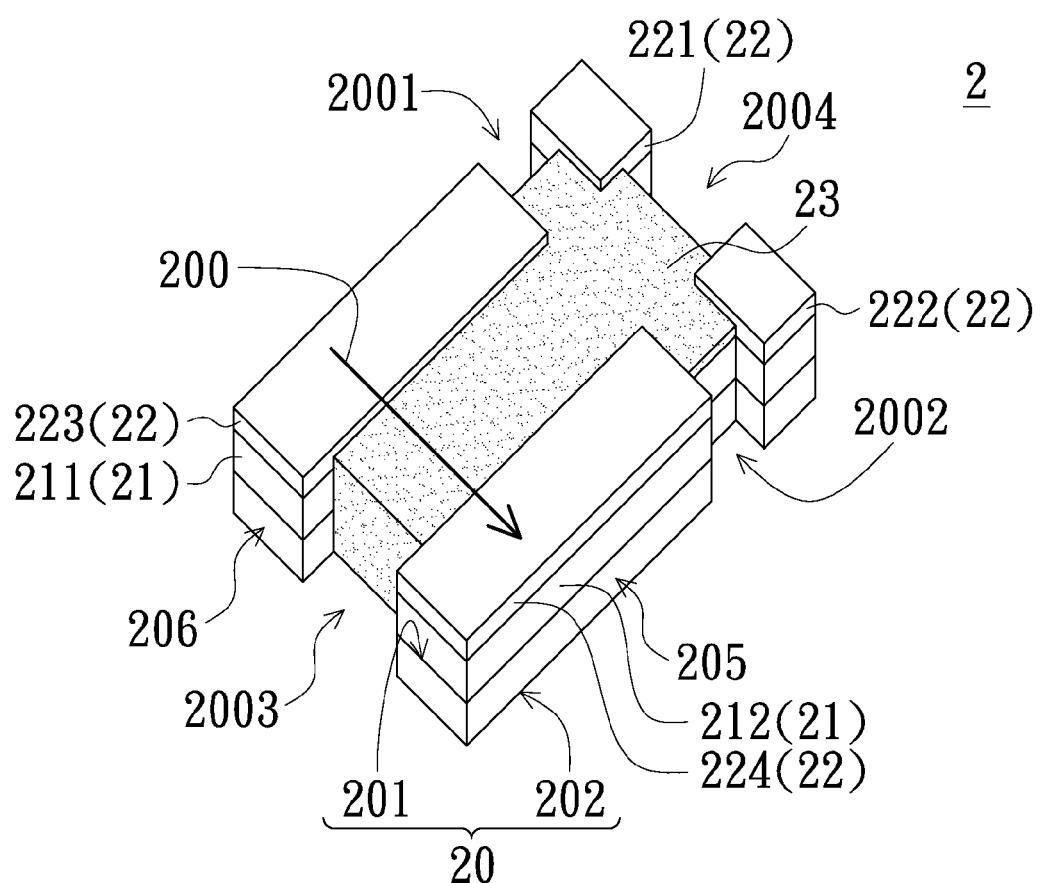
FIG. 3A is a perspective view schematically illustrating a resistor device according to a first embodiment of the present invention.
Figure 3B:
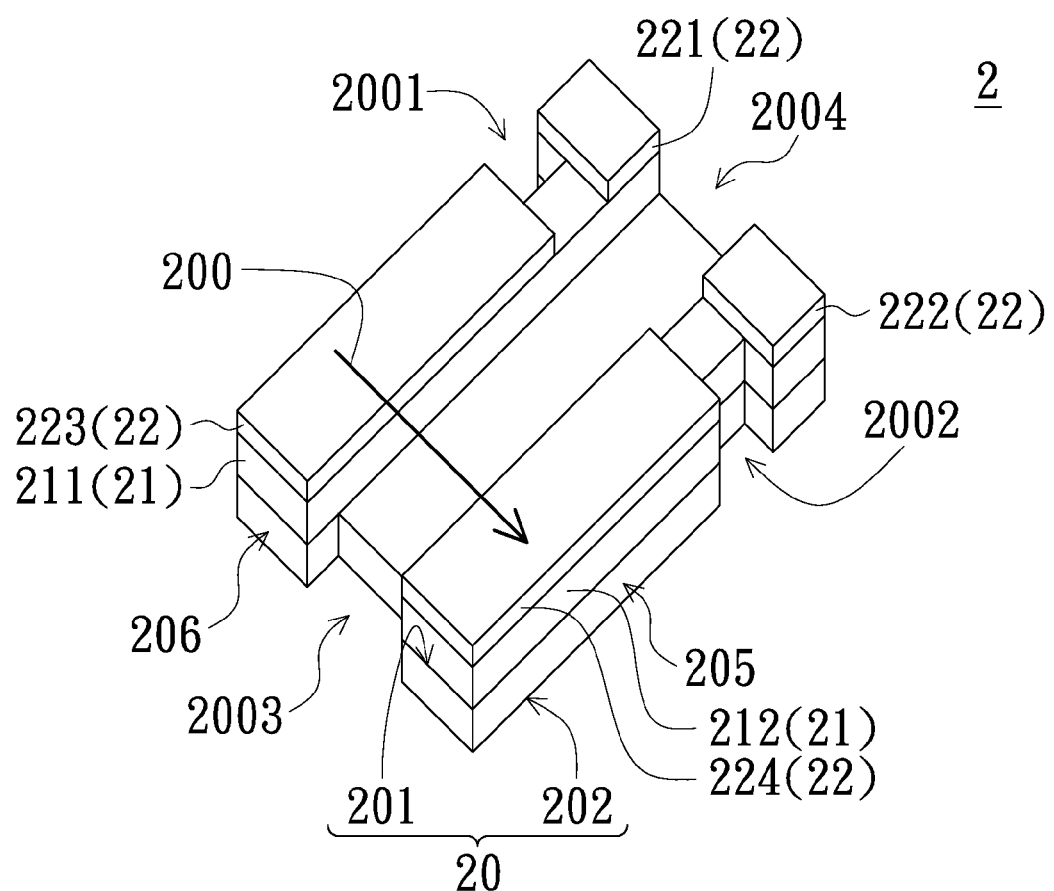
FIG. 3B is a perspective view schematically illustrating the resistor device of FIG. 3A, in which the protective layer is not shown.

Please refer to FIG. 3A and FIG. 3B. FIG. 3A is a prospective view schematically illustrating a current sensing resistor device according to a first embodiment of the present invention. FIG. 3B is a perspective view schematically illustrating the resistor device of FIG. 3A, in which the protective layer is not shown. In this embodiment, the current sensing resistor device 2 includes a resistor plate 20, a first metal layer 21, a second metal layer 22 and a protective layer 23. The resistor plate 20 has a first face 201 and a second face 202 opposite to the first face 201. The first metal layer 21 is disposed on the first face 201 of the resistor plate 20. As shown in FIG. 3B, the first metal layer 21 includes a first portion 211 and a second portion 212. In practice, the first portion 211 and the second portion 212 are disposed at opposite sides of the first face 201, and current may flow through a current path 200 between the first portion 211 of the first metal layer 21 and the second portion 212 of the first metal layer 21 through the resistor plate 20. It is to be noted that for clearly showing the first and second portions 211 and 212 of the first metal layer 21, the protective layer 23 shown in FIG. 3A is omitted from showing in FIG. 3B. The second metal layer 22 is disposed on the first metal layer 21, and has a first sensing pad 221, a second sensing pad 222, a first current pad 223 and a second current pad 224 separate from one another. Practically, the first sensing pad 221 and the first current pad 223 are stacked on the first portion 211 of the first metal layer 21; and the second sensing pad 222 and the second current pad 224 are stacked on the second portion 212 of the first metal layer 21. The protective layer 23 is disposed on the resistor plate 20 between the first portion 211 and second portion 212 of the first metal layer 21. Material of the protective layer 23 may be, but not limited to, epoxy resin. Any proper material exhibiting good electrically insulating property can be used as the protective layer 23.

In this embodiment, the resistor plate 20 is made of a material with a certain impedance, e.g. alloy or mixture of Manganese-copper, nickel-copper or nickel-phosphor. The first metal layer 21, for example, is formed on the resistor plate 20 by way of electric plating accompanied by microlithography; and the second metal layer 22, for example, is formed on the first metal layer 21 by way of electric plating accompanied by microlithography. It is to be noted that the above described materials and processes are given as examples only instead of limitations. For example, the first metal layer 21 may alternatively be made of copper; and the second metal layer 22 may alternatively be made of copper, nickel/tin or tin.

Figure 4A:
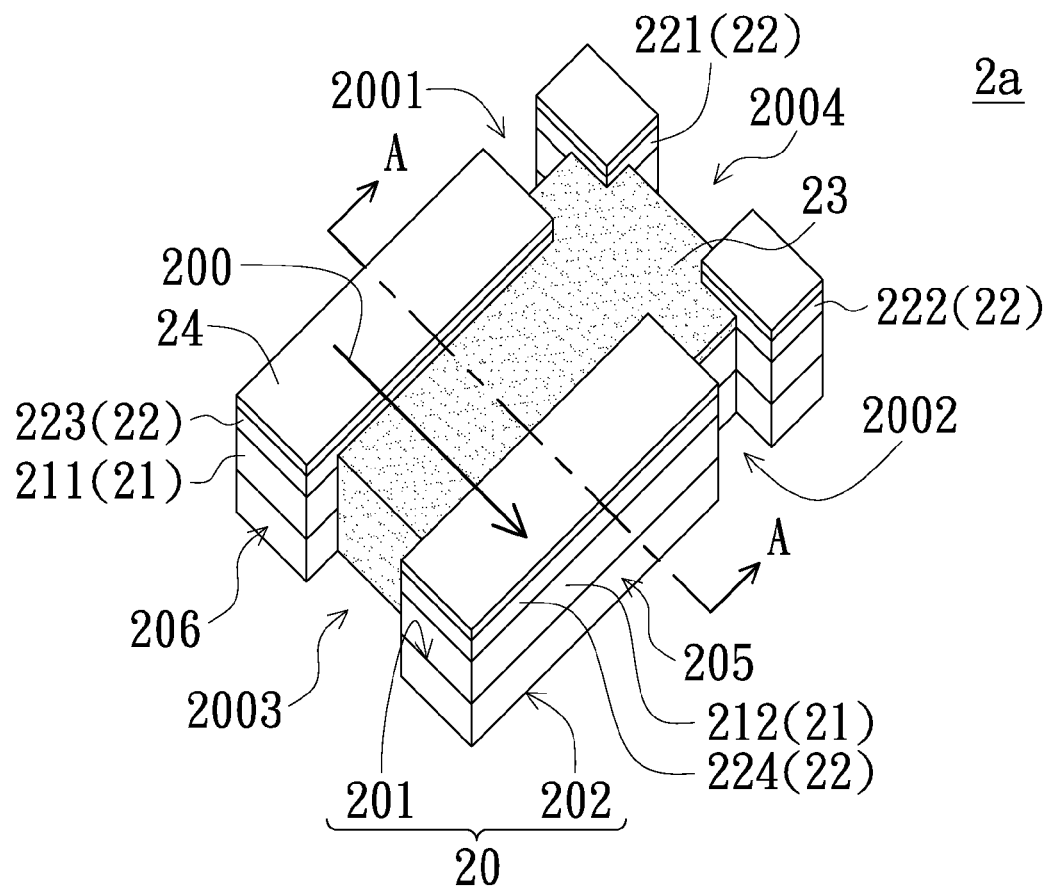
FIG. 4A is a perspective view schematically illustrating a resistor device according to a second embodiment of the present invention.
Figure 4B:
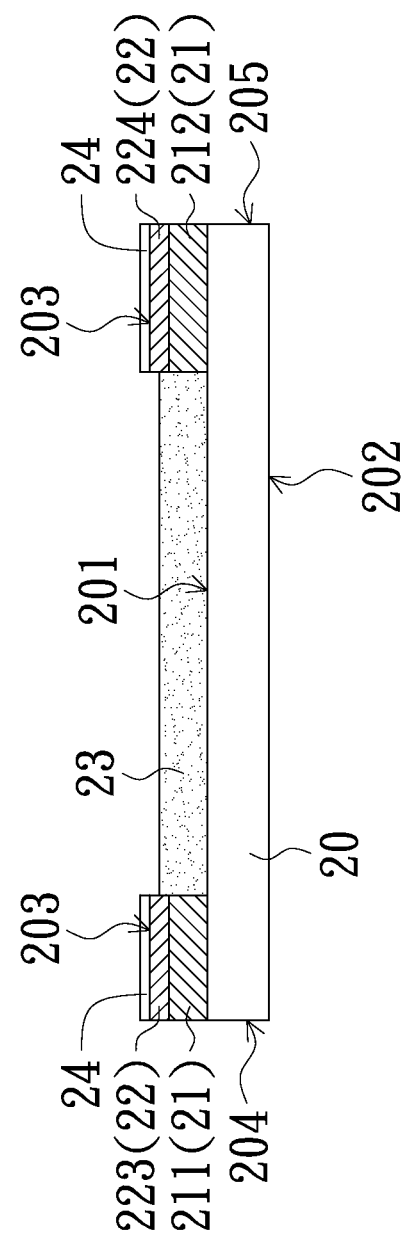
FIG. 4B is a schematic cross-sectional view of the resistor device taken along A-A line of FIG. 4A.
Figure 5:
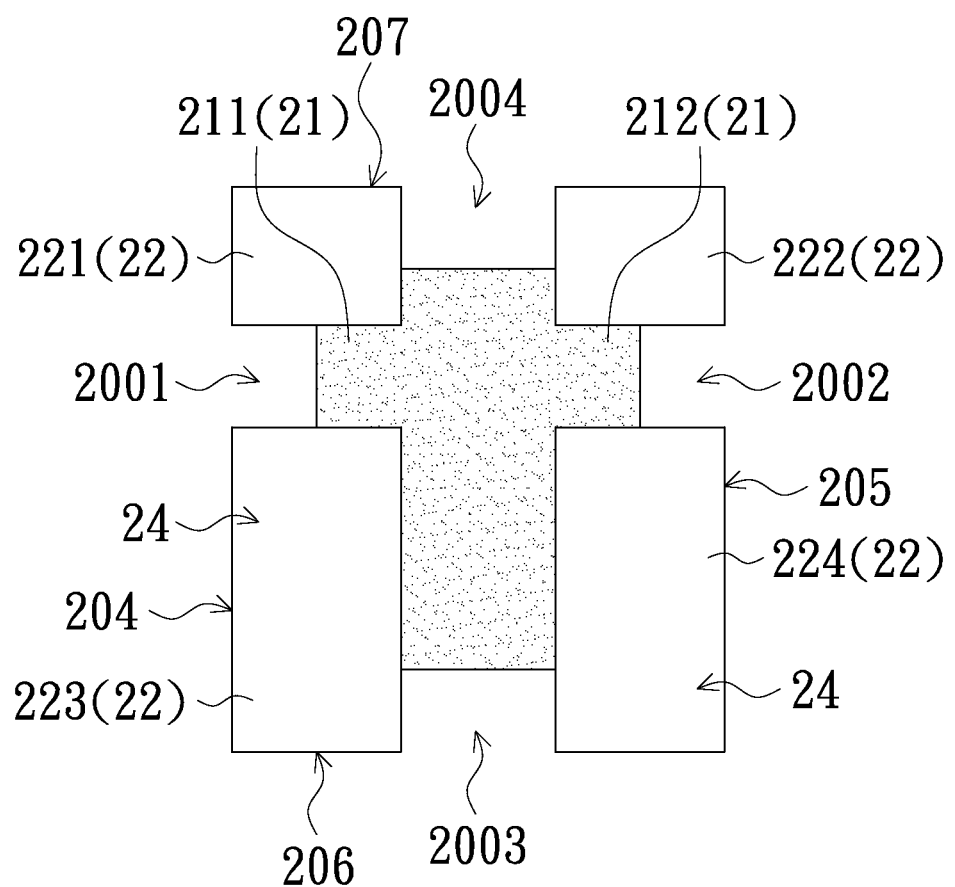
FIG. 5 is a top plane view schematically illustrating the resistor device of FIG. 4A.

Please refer to FIG. 4A, FIG. 4B and FIG. 5, in which a resistor device according to a second embodiment of the present invention is shown. FIG. 4B is a schematic cross-sectional view of the resistor device taken along A-A line of FIG. 4A. The resistor device 2a in this embodiment is similar to the resistor device 2 shown in FIG. 3A, but the resistor device 2a further includes a solder layer 24. Like the first embodiment of resistor device 2, the second metal layer 22 of the resistor device 2a is also divided into four separate portions serving as sensing and current pads, respectively, and the protective layer 23 extensively overlies the first portion 211 of the first metal layer 21 uncovered by the sensing pad 221 and the current pad 223 of the second metal layer 22 and the second portion 212 of the first metal layer 21 uncovered by the sensing pad 222 and the current pad 224 so that no metal in this area is exposed. The solder layer 24 is disposed on the second metal layer 22. Concretely, the solder layer 24 is disposed on the top surfaces 203 of the first sensing pad 221, the second sensing pad 222, the first current pad 223 and the second current pad 224. To couple the resistor device 2a to an external circuit board (not shown), the top surfaces 203 of the first sensing pad 221, the second sensing pad 222, the first current pad 223 and the second current pad 224 are oriented towards the circuit board and made electrically connected to the circuit board. The assembling of the resistor device 2a and the external circuit board will be described in more detail in subsequent embodiments.

It is to be noted that if the second metal layer 22 of the resistor plate 2 shown in FIG. 3A is formed of tin, the second metal layer 22 may function like the solder layer 24 shown in FIG. 4A.

Refer to FIGS. 4A, 4B and 5 again. The resistor plate 20 of the resistor device 2a has first and second sides 204 and 205 opposite to each other, and third and fourth sides 206 and 207 opposite to each other. At the first side 204, the second side 205, the third side 206 and the fourth side 207, a first recess 2001, a second recess 2002, a third recess 2003 and a fourth recess 2004 are formed. The first recess 2001 is disposed between the first sensing pad 221 and the first current pad 223. The second recess 2002 is disposed between the second sensing pad 222 and the second current pad 224. The recess 2003 is disposed between the first current pad 223 and the second current pad 224. The recess 2004 is disposed between the first sensing pad 221 and the second sensing pad 222. In this embodiment, the width of the first recess 2001 is substantially equal to that of the second recess 2002; and the width of the third recess 2003 is substantially equal to that of the fourth recess 2004. However, the width of each the recess may vary with practical requirements and is not limited to the above example. For example, in addition to possible difference in width between recesses 2003 and 2004 at opposite sides, the depth of the recess 2003 and that of the recess 2004 may also be different. Temperature Coefficient of Resistance (TCR) and resistance can be adjusted by varying the width and/or depth of the recesses. Furthermore, the first recess 2001 and the second recess 2002 are symmetrically or asymmetrically disposed at the first side 204 and the second side 205 of the resistor plate 20. In other words, the first recess 2001 and the second recess 2002 do not have to be symmetrically disposed as shown, but may be staggered from each other.

With the arrangement of the first recess 2001, the second recess 2002, the third recess 2003 and the fourth recess 2004, the measuring error of resistance conducted by Kelvin measurement can be effectively reduced. Furthermore, by properly trimming the resistor plate, a high-precision current sensing resistor device can be obtained.

Figure 6A:
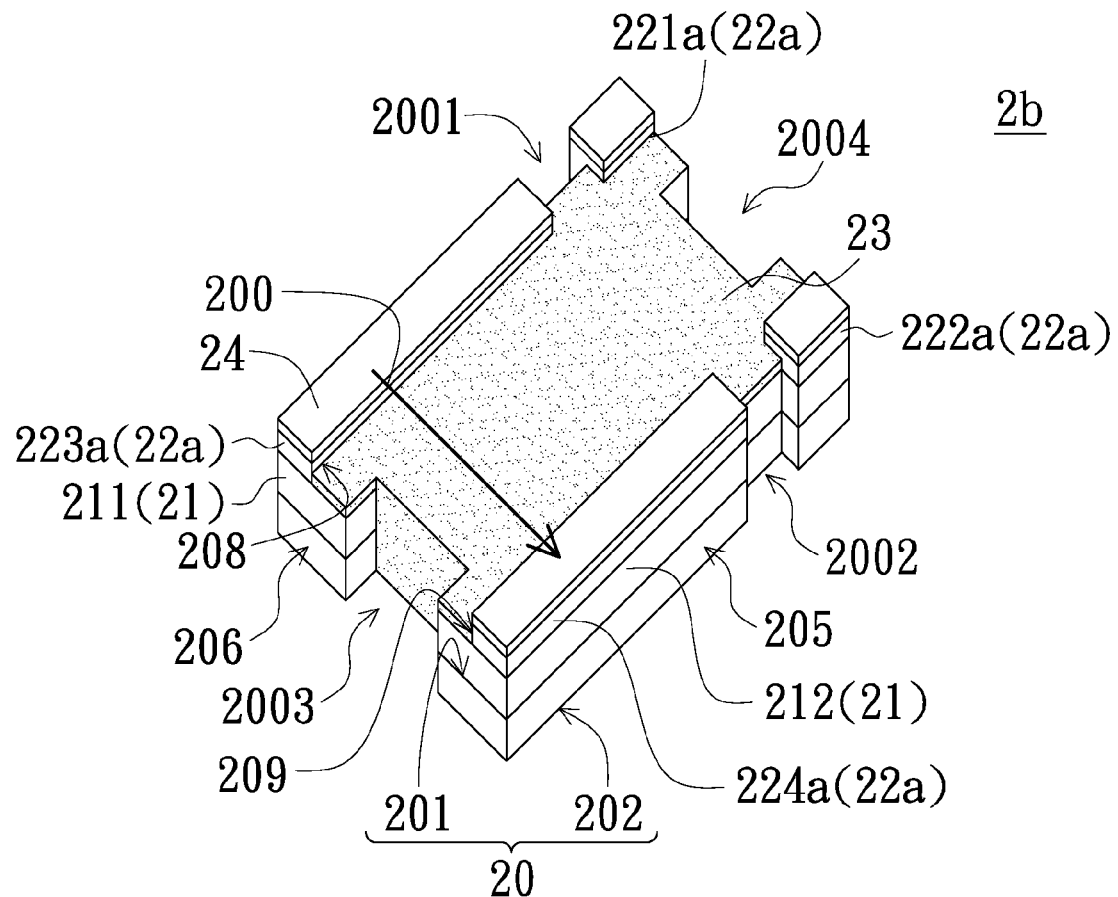
FIG. 6A is a perspective view schematically illustrating a resistor device according to a third embodiment of the present invention.
Figure 6B:
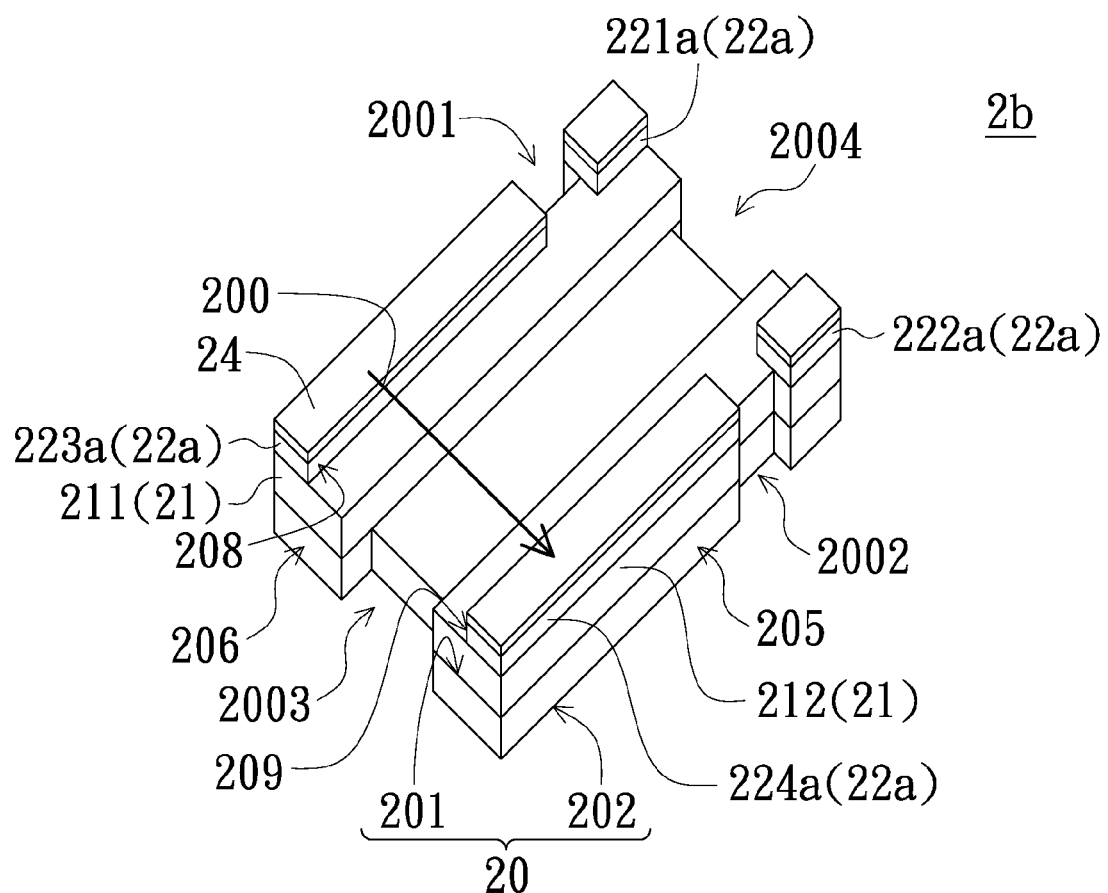
FIG. 6B is a perspective view schematically illustrating the resistor device of FIG. 6A, in which the protective layer is not shown.
Figure 6C:
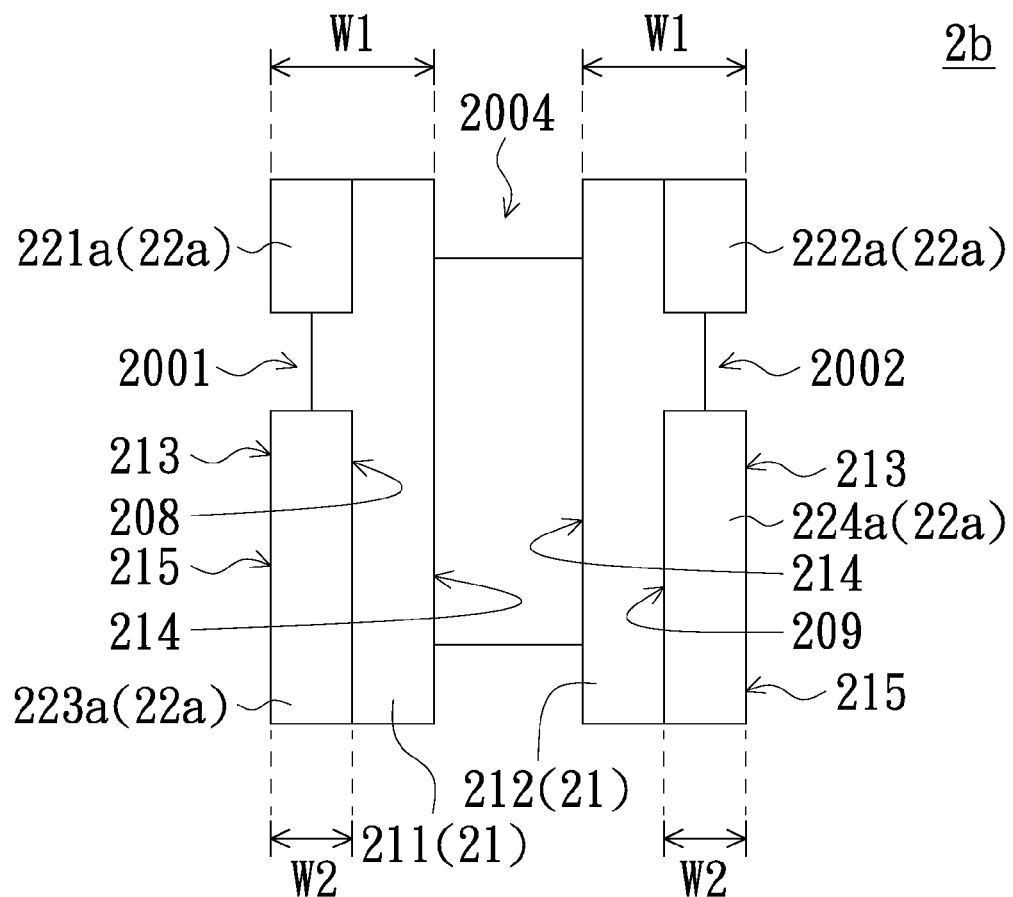
FIG. 6C is a top plane view schematically illustrating the resistor device of FIG. 6B.

Please refer to FIGS. 6A, 6B and 6C, in which a resistor device according to a third embodiment of the present invention is shown. The configuration of the resistor device 2b is similar to that of the resistor device 2a shown in FIGS. 4A, 4B and 5 with some modifications. FIG. 6B, in which the protective layer 23 is not shown, is further referred to clearly understand the structure of the resistor device 2b. As shown in FIG. 6C, the first portion 211 and the second portion 212 of the first metal layer 21 of the resistor device 2b have outward opposite sides 213 and inward opposite sides 214, respectively. The distance between each pair of the outward and inward opposite sides 213 and 214 is, for example, W1. On the other hand, portions of the second metal layer 22a of the resistor device 2b separately formed on the first portion 211 and the second portion 212 of the first metal layer 21 have outward opposite sides 215 and inward opposite sides 208 and 209, respectively. The distance between each pair of the outward and inward opposite sides 215 and 208 (or 209) is, for example, W2. In this embodiment, each of the width of the first sensing pad 221a and the width of the first current pad 223a of the second metal layer 22a, i.e. W2, is smaller than the width of the first portion 211 of the first metal layer 21, i.e. W1. Meanwhile, the protective layer 23 extends to the upper surface of the first portion 211 of the first metal layer 21, which is uncovered by the first sensing pad 221a and the first current pad 223a of the second metal layer 22a. Likewise, each of the width of the second sensing pad 222a and the width of the second current pad 224a of the second metal layer 22a, i.e. W2, is smaller than the width of the second portion 212 of the first metal layer 21, i.e. W1. Viewing from the front side, opposite step shapes formed by the first metal layer 21 and the second metal layer 22a are shown. In this embodiment, the sides 215 of the second metal layer 22a aligns with the sides 213 of the first metal layer 21 while the sides 208 and 209 contract from the sides 214. Meanwhile, the protective layer 23 extends to the upper surface of the second portion 212 of the first metal layer 21, which is uncovered by the second sensing pad 222a and the second current pad 224a of the second metal layer 22a.

For example only, the width W2 of the second metal layer 22a is about a half of the width W1 of the first portion 211 or the second portion 212 of the first metal layer 21. The widths of the first metal layer and the second metal layer, the widths of different portions of the first or second metal layer and/or the width ratio of the second metal layer to the first metal layer may vary with practical requirements.

By having the level of the second metal layer 22a and the solder layer 24 higher than the protective layer 23, the reflow soldering of the second metal layer 22a and the solder layer 24 onto the circuit board as electrodes can be performed with satisfactory flatness so as to avoid defects such as tombstone or missing solder. Moreover, properly adjustment of the width of the second metal layer 22 as well as the width of the solder layer 24 based on practical design may prevent overflow of the solder material.

Figure 7:
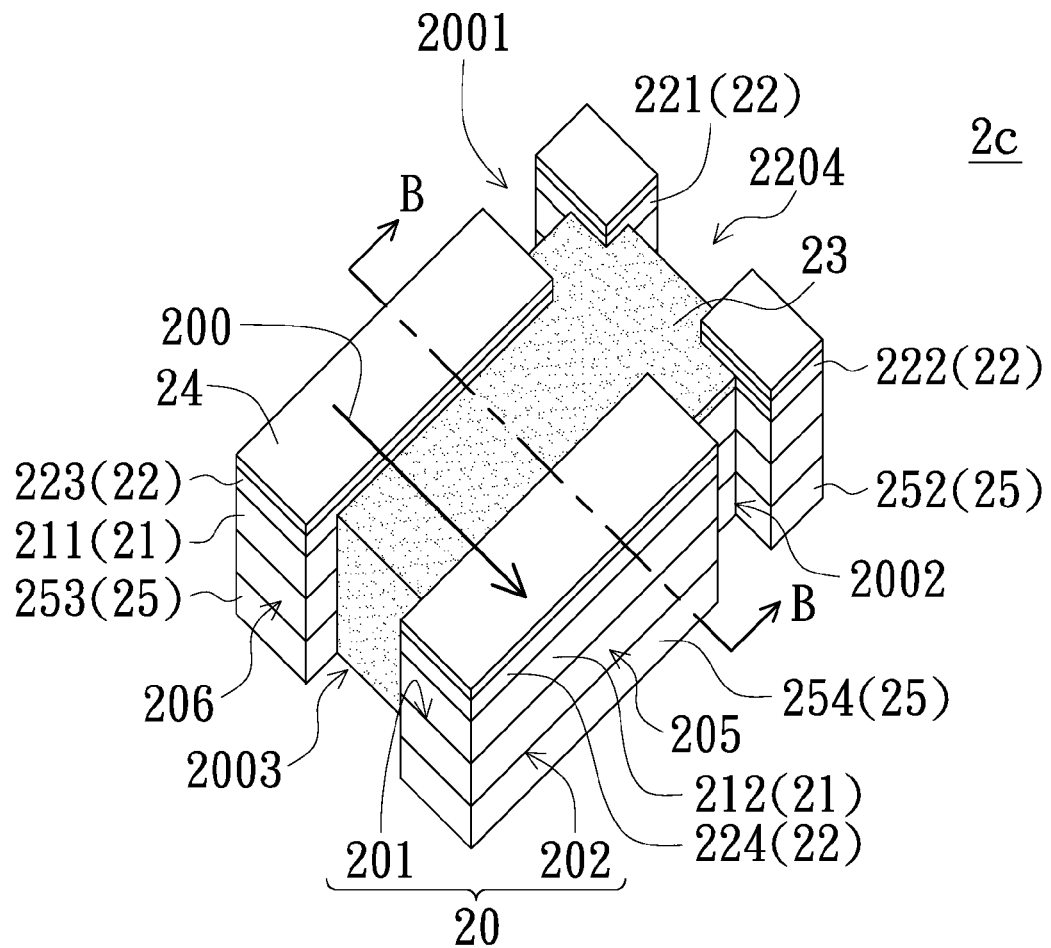
FIG. 7 is a perspective view schematically illustrating a resistor device according to a fourth embodiment of the present invention.
Figure 8:
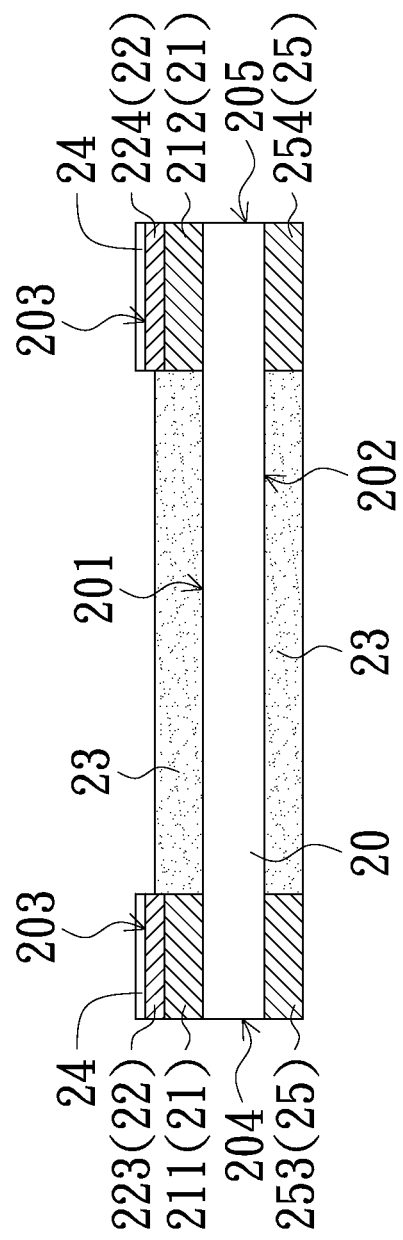
FIG. 8 is a schematic cross-sectional view of the resistor device taken along B-B line of FIG. 7.
Figure 9:
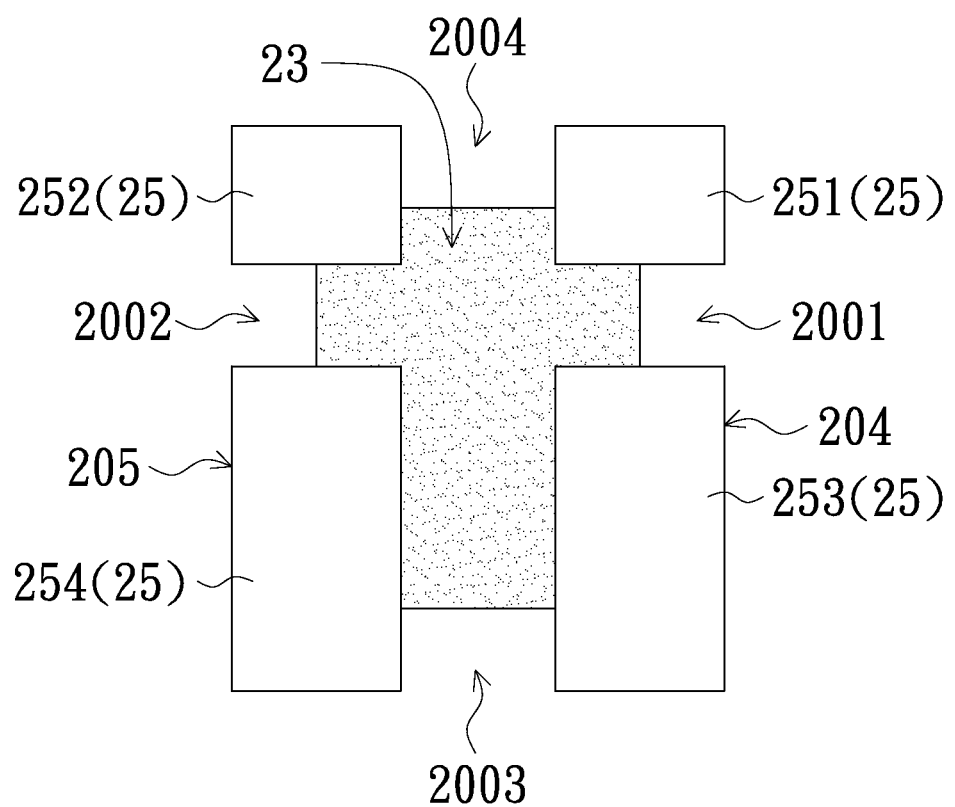
FIG. 9 is a bottom view of the resistor device as shown in FIG. 7.

Please refer to FIGS. 7, 8 and 9, in which a resistor device according to a fourth embodiment of the present invention is shown. FIG. 8 is a schematic cross-sectional view of the resistor device taken along B-B line of FIG. 7. The configuration of the resistor device 2c is similar to that of the resistor device 2a shown in FIGS. 4A, 4B and 5 with some modifications. The resistor device 2c in this embodiment further includes an auxiliary layer 25 disposed on the resistor plate 20 and defined with four separate blocks 251, 252, 253 and 254, which function for strengthening the entire resistor device and preventing from heat warp. In this embodiment, the blocks 251, 252, 253 and 254 correspond to the first sensing pad 221, the second sensing pad 222, the first current pad 223 and the second sensing pad 224, respectively, and are kept insulated from the pads. Concretely, the blocks 251, 252, 253 and 254 are disposed on the second surface 202 at four corners of the resistor plate 20. In this embodiment, the protective layer 23 overlies the resistor plate 20 on both the first surface 201 and the second surface 202 among the blocks 251, 252, 253 and 254 as a substantially cross shape. Alternatively, the blocks 251, 252, 253 and 254 can also be covered by the protective layer 23. In addition to effective heat dissipation, the isolation of the auxiliary blocks 251, 252, 253 and 254 is advantageous as avoiding the Kevin measurement from being interfered by the undesired current flows among those blocks. The material adapted for producing the auxiliary layer 25 should exhibit highly strength and good conductivity. For example, the auxiliary layer 25 may be made of copper. It is to be noted that the auxiliary layer 25 in this embodiment includes four blocks, but the number of blocks included in the auxiliary layer 25 may vary with practical requirements.

The first metal layer and the second metal layer in the above embodiments can be made of the same or different material.

Figure 10:
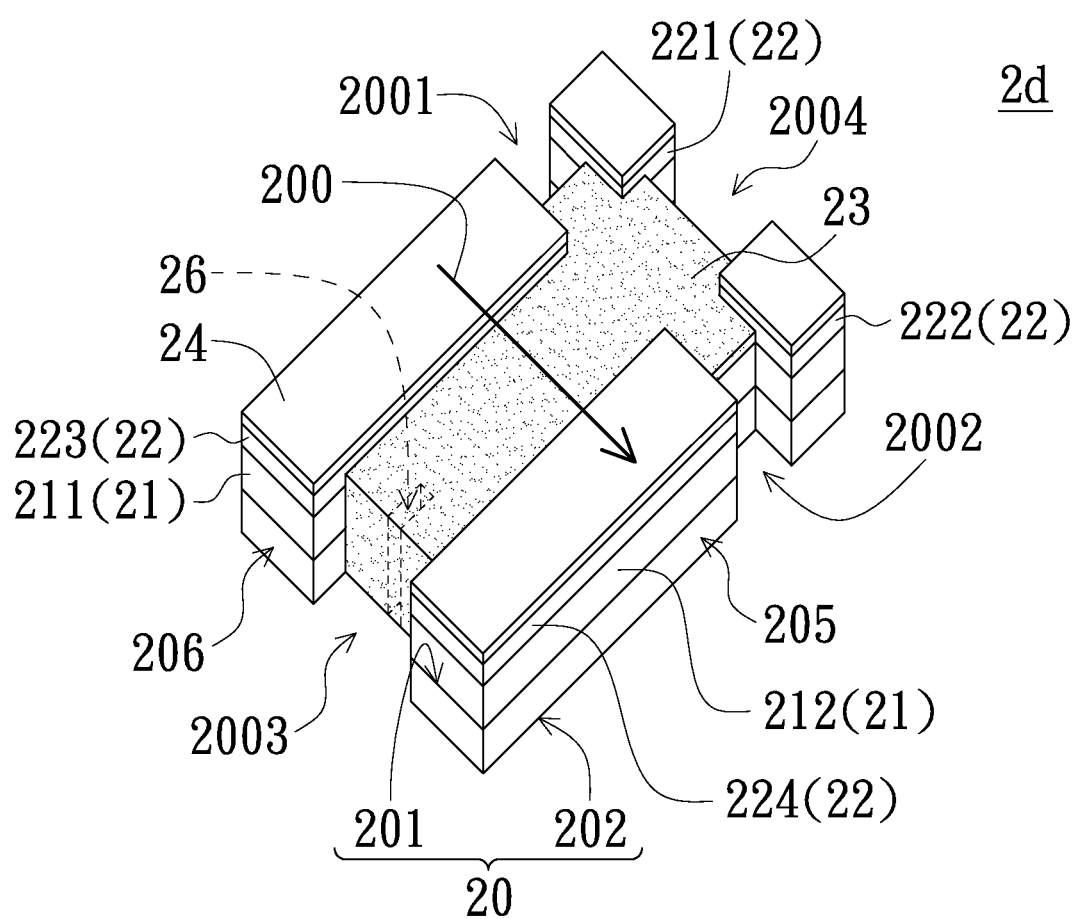
FIG. 10 is a perspective view schematically illustrating a resistor device according to a fifth embodiment of the present invention.

Please refer to FIG. 10, in which a resistor device according to a fifth embodiment of the present invention is shown. The configuration of the resistor device 2*d* is similar to that of the resistor device 2*a* shown in FIGS. 4A, 4B and 5 with some modifications. There is a slit 26 formed in the resistor plate 20 of the resistor device 2*d*. In this embodiment, the slit 26 extends into the resistor plate 20 from the third recess 2003 by way of laser cutting. Since the resistance of the resistor will vary with the length of the slit 26, as well as the number of the slit 26, the size and number of the slit 26 are determined according to the resistance level to be reached. The positions and sizes of the recesses should be well selected so as to reach a target value of resistance with minimized measurement and adjustment repetitions. The provision of the recesses and slit facilitates fine-tuning of the resistance of the resistor by simply modifying the configuration of the resistor plate.

Figure 11:
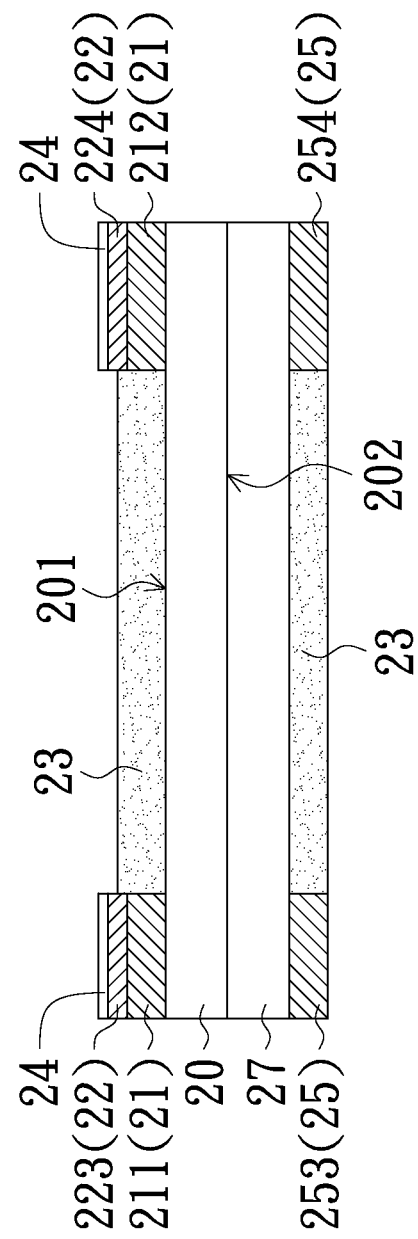
FIG. 11 is a side view schematically illustrating a resistor device according to a sixth embodiment of the present invention.

FIG. 11 is a side view schematically illustrating a resistor device according to a sixth embodiment of the present invention. The configuration of the resistor device 2*e* is similar to that of the resistor device 2*c* shown in FIGS. 7, 8 and 9 with some modifications. The resistor device 2*e* further includes a carrier plate 27 disposed between the resistor plate 20 and the auxiliary layer 25. Concretely, the carrier plate 27 is disposed on the second surface 202 of the resistor plate 20. The carrier plate 27 functions for supporting the resistor plate 20 and for example but not for limitation, it may be made of ceramic.

Figure 12:
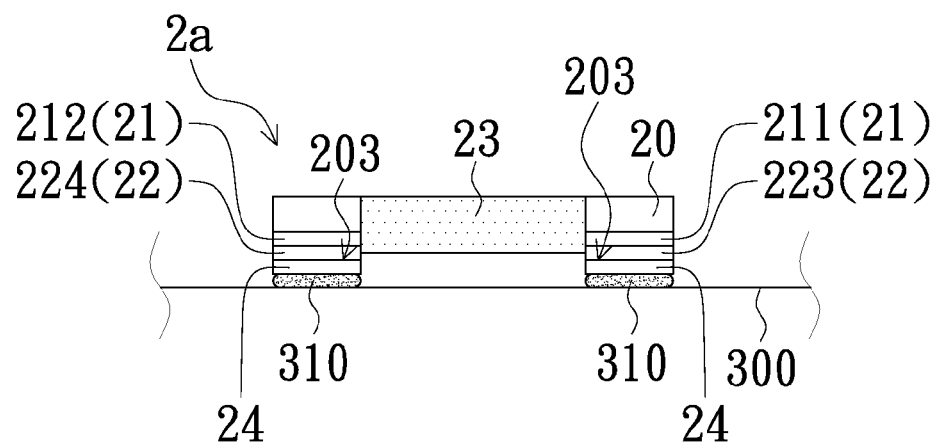
FIG. 12 is a schematic diagram illustrating a mounting example of a resistor device according to the present invention onto a circuit board.
Figure 13:
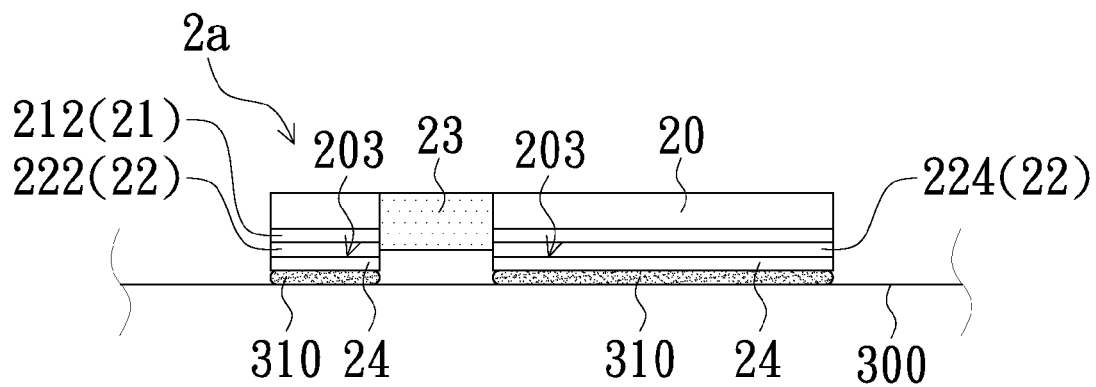
FIG. 13 is a schematic diagram illustrating another mounting example of a resistor device according to the present invention onto a circuit board.

FIG. 12 and FIG. 13 schematically illustrate the mounting of the embodiment of the resistor device 2*a* shown in FIGS. 4A, 4B and 5 onto a circuit board in different views. By subjecting the resistor device 2*a* to reflow soldering, the soldering layer 24 formed on the first sensing pad 221, the second sensing pad 222, the first current pad 223 and the second current pad 224 of the second metal layer 22 become electrically connected to the solder pad 310 of the circuit board 300 so as to be mounted onto the circuit board 300. The protective layer 23 disposed among the first sensing pad 221, the second sensing pad 222, the first current pad 223 and the second current pad 224 of the second metal layer 22 is preferably made of but not limited to epoxy resin. As known, epoxy resin is a good solder mask which prevents molten solder from sticking to the surface of the protective layer in the reflow soldering process so as to avoid short circuits among pads.

As described above, the resistor device according to the present invention has a dual metal layer structure, and the upper metal layer includes separate portions serving as first and second sensing pads and first and second current pads. Furthermore, the protective layer extends between the sensing pads and the current pads and overlies the lower metal layer, thereby preventing the value and uniformity of the resistance of the resistor device from interference by the exposed metal disposed between the first and second sensing pads and first and second current pads. Further modifications such as the provision of the auxiliary layer and/or the resistance-tuning slit, although not essential, facilitates improvement of the property of the resistor device.

While the invention has been described in terms of what is presently considered to be the most practical and preferred embodiments, it is to be understood that the invention needs not to be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A resistor device, comprising:
a resistor plate having opposite first and second surfaces;
a first metal layer including first and second portions which are disposed on the first surface of the resistor plate at opposite first and second sides, respectively; and
a second metal layer including a first sensing pad, a second sensing pad, a first current pad and a second current pad, separate from one another, wherein the first sensing pad and the first current pad are disposed on the first portion of the first metal layer and the second sensing pad and the second current pad are disposed on the second portion of the first metal layer.

2. The resistor device according to claim 1, wherein none of the first sensing pad, second sensing pad, first current pad and second current pad of the second metal layer extend beyond the area of the first metal layer.

3. The resistor device according to claim 1, wherein each of the first sensing pad and the first current pad of the second metal layer has smaller length and width than the first portion of the first metal layer, and each of the second sensing pad and the second current pad of the second metal layer has smaller length and width than the second portion of the first metal layer.

4. The resistor device according to claim 1, further comprising a protective layer, which overlies the resistor plate between the first portion and the second portion of the first metal layer and extensively overlies the first metal layer uncovered by the second metal layer.

5. The resistor device according to claim 4, wherein the protective layer is formed of epoxy resin.

6. The resistor device according to claim 4, wherein a level of the protective layer is lower than that of the second metal layer.

7. The resistor device according to claim 1, further comprising a solder layer overlying the first sensing pad, second sensing pad, first current pad and second current pad of the second metal layer.

8. The resistor device according to claim 1, wherein a first recess is formed between the first sensing pad and the first current pad, a second recess if formed between the second sensing pad and the second current pad, wherein the width and depth of the first recess are equal to the width and depth of the second recess.

9. The resistor device according to claim 8, wherein the first recess and the second recess are symmetrically disposed at a first side and a second side of the resistor plate, respectively.

10. The resistor device according to claim 8, wherein the first recess and the second recess are asymmetrically disposed at a first side and a second side of the resistor plate, respectively.

11. The resistor device according to claim 1, wherein a third recess is formed between the first current pad and the second current pad, and a fourth recess is formed between the first sensing pad and the second sensing pad, wherein the depth of the third recess is unequal to the depth of the fourth recess.

12. The resistor device according to claim 1, further comprising a slit created in the resistor plate between the first sensing pad and the second sensing pad or between the first current pad and the second current pad.

13. The resistor device according to claim 1, further comprising an auxiliary layer on the second surface of the resistor plate.

14. The resistor device according to claim 13, wherein the auxiliary layer includes at least two separate blocks.

15. The resistor device according to claim 13, further comprising a protective layer, which overlies the first surface of the resistor plate between the first portion and the second portion of the first metal layer, the first metal layer uncovered by the second metal layer, and the second surface of the resistor plate uncovered by the auxiliary layer.

16. The resistor device according to claim 13, wherein the auxiliary layer includes four separate blocks, each having a position corresponding to one of the first sensing pad, second sensing pad, first current pad and second current pad of the second metal layer.

17. The resistor device according to claim 13, further comprising a carrier plate disposed between the resistor plate and the auxiliary layer.

* * * * *